United States Patent [19]

Shinozaki et al.

[11] Patent Number: 4,933,258

[45] Date of Patent: Jun. 12, 1990

[54] USE OF PHOTOSENSITIVE IMAGE RECEIVING SHEET MATERIAL IN IMAGING TRANSFER PROCESS

[75] Inventors: Fumiaki Shinozaki; Kazuo Suzuki; Tamotsu Suzuki; Tomizo Namiki; Tomohisa Tago; Mikio Totsuka, all of Shizuoka, Japan

[73] Assignee: Fuji Photo Film Co., Ltd., Kanagawa, Japan

[21] Appl. No.: 319,864

[22] Filed: Mar. 6, 1989

Related U.S. Application Data

[60] Division of Ser. No. 271,336, Nov. 10, 1988, abandoned, which is a continuation of Ser. No. 64,476, Jun. 22, 1987, abandoned.

[30] Foreign Application Priority Data

Jun. 23, 1986 [JP] Japan ............................... 61-146578

[51] Int. Cl.$^5$ ............................................. G03C 11/12
[52] U.S. Cl. .................................... 430/260; 430/258; 430/262; 430/263; 430/271; 430/330; 430/950
[58] Field of Search ............... 430/256, 258, 260, 262, 430/263, 271, 338, 950

[56] References Cited

U.S. PATENT DOCUMENTS

| | | | |
|---|---|---|---|
| 4,174,216 | 11/1979 | Cohen et al. | 430/258 |
| 4,262,079 | 4/1981 | Steelman et al. | 430/253 |
| 4,376,158 | 3/1983 | Spechler | 430/143 |
| 4,482,625 | 11/1984 | Namiki et al. | 430/257 |
| 4,559,292 | 12/1985 | Geissler et al. | 430/256 |
| 4,686,163 | 8/1987 | Ng et al. | 430/47 |
| 4,766,053 | 8/1988 | Shinozaki et al. | 430/256 |

*Primary Examiner*—Jack P. Brammer
*Attorney, Agent, or Firm*—Sughrue, Mion, Zinn, Macpeak & Seas

[57] ABSTRACT

A photosensitive image receiving sheet material employable for color proofing and color display which comprises a photopolymerizable adhesive layer provided on a support via a releasable organic high-molecular polymer layer.

6 Claims, No Drawings

USE OF PHOTOSENSITIVE IMAGE RECEIVING SHEET MATERIAL IN IMAGING TRANSFER PROCESS

This is a division of application Ser. No. 271,336 filed Nov. 10, 1988, now abandoned, which is a continuation of application Ser. No. 064,476 filed Jun. 22, 1987, now abandoned.

BACKGROUND OF THE INVENTION

1. Field of the Invention

The present invention relates to a transfer sheet employable as color proof for use in color proofing or display, and more particularly relates to a photosensitive image receiving sheet material suitable for use in an image forming process which comprises transferring a transferable image formed on a temporary support to an image receiving sheet material and then re-transferring said image to a permanent support.

2. Description of prior art

There is known an image transfer process which comprises exposing a photosensitive laminate composed of a peelable layer consisting of an organic polymer and a photosensitive resin layer provided on a temporary support to light, developing it to form an image on the peelable layer and transferring the image onto a given support (i.e., permanent support) by using an adhesive (see, Japanese Patent Publication No. 46(1971)-15326 and No. 49(1974)-441). This process had advantages in that it can be used as color proof for various procedure such as of overlay type, surprint type, etc. However, that process has disadvantages in that an adhesive has to be used for every transferring operation and hence the process is complicated and in that there is a difficulty in keeping the accuracy of registration in transferring each color.

To eliminate the complication of the process, there are proposed processes wherein after the formation of an image, the image is laminated to a permanent support under the application of heat and pressure (see, Japanese Patent Provisional Publications No. 47(1972)-41830, No. 48(1973)-9337 and No. 51(1976)-5101). Particularly, Japanese Patent Provisional Publication No. 51(1976)-5101 discloses that a hot-melt polymer layer as an adhesive is provided on a permanent support and Japanese Patent Provisional Publication No. 47(1972)-41830 discloses that an image is laminated directly to a permanent support such as art paper or coated paper.

However, these processes still have various disadvantages in that the final image is laminated to a permanent support in such a manner that the right and the left are reversed against the original image and in that when a hot-melt polymer is used as an adhesive, the melting point thereof is usually high and hence the transferring temperature has to be high so that the dimensional stability of the support is lowered by the influence of heat, and the deviation of colors from one another in registration is caused in transferring each color. When a hot-melt polymer having a low melting point is used as an adhesive, there are the problems that after the formation of an image, sticking is caused, or the surface thereof is liable to be marred.

As a process for eliminating the above-described disadvantages, there is proposed in Japanese Patent Provisional Publication No. 59(1984)-97140 a process wherein an image is laminated to a temporary image receiving sheet before the image is laminated onto a permanent support. This process includes steps of: preparing a temporary image receiving sheet provided with an image receiving layer composed of a photopolymerizable material on a support; transferring an image of each color onto the temporary image receiving sheet before the image of each color is laminated to a permanent support; re-transferring said image onto a permanent support; and exposing wholly it to light to cure the laminated photopolymerizable image-receiving layer.

The above-described image transferring process using the temporary image receiving sheet (hereinafter referred to simply as image receiving sheet) is very effective in eliminating the aforementioned problems. In more detail, there are the following advantages. An erect image corresponding to the masked original image can be formed on the permanent support. Since an ethylenically unsaturated polyfunctional monomer serving as a photopolymerizable substance is incorporated in the photopolymerizable image receiving layer of the image receiving sheet, the photopolymerizable image-receiving layer itself is soft, transferring can be carried out at a low temperature and after transferring, it can be exposed wholly to light to cure it. In more detail, there are the advantages that after the transfer of the image, sticking is not caused and the final image has high resistance to marring.

In the image receiving sheet employed in the process of the Japanese Patent Provisional Publication No. 59(1984)-97140, adhesion betweeen the photopolymerizable image receiving layer (that is, photopolymerizable adhesive layer) and the support is very high in the unexposed state. Therefore, when the photopolymerizable adhesive layer having a received image is laminated to the final support and the support for the image receiving material is peeled off before the exposure operation, peel marks (that is, linear crack produced on the photopolymerizable adhesive layer due to excessive shock brought about by the peeling operation, or stain given by a portion of the adhesive layer remaining on the surface of the image-receiving layer) are liable to be formed on the surface of the laminated image-containing photopolymerizable adhesive layer. Hence, in the process of the Japanese Patent Provisional Publication No. 59(1984)-97140, the image-containing photopolymerizable adhesive layer is laminated to the final support and the whole is exposed to light to cure the photopolymerizable adhesive layer. At the same time, adhesion between the photopolymerizable adhesive layer and the support of the image receiving sheet is lowered and the support is removed.

Though the above-described image transferring process is effective in obtaining the final image of high quality, the present inventors have found that said process should be improved on the following problems.

When a support having high surface smoothness is used as a support for the image receiving sheet in said image transferring process using an image receiving sheet, the surface of the final image laminated to a permanent support is glossy. On the other hand, when a color proof for color proofing is to be prepared utilizing the image transferring process, it is necessary that the surface of the color proof is roughened to allow it to approximate to the surface of a print. Roughening is generally performed using a process wherein an appropriate mat film is laminated on the surface of the final image and then the surface of the image is matted by heating under pressure.

In order to mat the surface of the final image formed on the permanent support by the process stated in the Japanese Patent Provisional Publication No. 59(1984)-97140, a mat film is placed on the cured (i.e., hardened) adhesive layer, and heat and pressure must be applied to the surface. High heat and high pressure are required for the matting of the surface of the image, and the final image is liable to suffer deterioration under such severe conditions.

In other problems, when a photosensitive material which is a positive type and release nitrogen gas during photolysis such as naphthoquinone diazide is used in the transferable photosensitive image forming material, naphthoquinone diazide is decomposed and nitrogen gas is released in curing the photopolymerizable adhesive layer by light exposure. Nitrogen gas stays at the interface between the image part and the cured adhesive layer. Thus, when a subsequent high-temperature matting treatment is carried out, the interface is deformed by expansion of the nitrogen gas and the quality of the image is deteriorated.

In summary, it is desirable that the matting of the surface of the image is carried out in such a manner that while the image receiving layer is still soft (that is, before the photopolymerizable material of the photopolymerizable image receiving layer together with image placed on the permanent support is cured), and an appropriate mat film is placed on the surface of the image and the surface of the image is matted by heating under pressure. However, there is a problem that peel marks are formed on the surface of the image receiving layer in removing the support for the image receiving sheet from the laminated photopolymerizable image receiving layer as described above.

SUMMARY OF THE INVENTION

It is an object of the present invention to provide a photosensitive image receiving sheet suitable for use in performing an image forming process comprising transferring a transferable image formed on a temporary support to an image receiving sheet material and then re-transferring said image to a permanent support.

There is provided by the present invention a photosensitive image receiving sheet material comprising a photopolymerizable adhesive layer provided on a support via a peelable organic high-molecular polymer layer.

The photosensitive image receiving sheet material of the invention is suitable for use in the above-described improved image forming process wherein after an image laminated onto the photopolymerizable adhesive layer of the image receiving sheet material is re-laminated to a permanent support, the support for the image receiving material is removed by utilizing the peelable organic high-molecular polymer layer prior to light exposure procedure (i.e., curing operation), and then the matting procedure and exposure procedure are carried out.

Accordingly, there is the advantage that when the photosensitive image receiving sheet material of the present invention is used, there can be effectively prevented lowering in the quality of image which is caused in the course of the roughening (matting) of the surface of the image in the image forming process (or image transferring process) including steps of transferring an image from a temporary support to an image receiving sheet and re-transferring the laminated image to the final support. When the above-described improved process is used, there is an additional advantage that the matting of the surface of the image can be easily conducted at a relatively low temperature and under low pressure, because the surface of the photopolymerizable adhesive layer is still in a soft state before exposure.

DETAILED DESCRIPTION OF THE INVENTION

As the support for the image receiving sheet material, a transparent support having high dimensional stability under a high temperature condition is preferred. Examples of such support include polyethyleine terephthalate film and polycarbonate films. However, the supports which can be employed in the invention are not limited thereto.

The surface of the support for the image receiving sheet material may be treated by releasing agents, corona discharge or glow discharge so that adhesion between said support and the high-molecular polymer layer is made higher than that between the temporary support and the image forming layer directly formed on the temporary support, while said adhesion between the support and the polymer layer is made lower than that between the relaminated image forming layer and the permanent support in re-transferring the image onto the permanent support.

Examples of materials which can be used to the preparation of the peelable organic high-molecular polymer layer of the invention include polyolefins such as polyethylene and polypropylene; ethylene copolymers such as copolymers of ethylene and vinyl acetate and copolymers of ethylene and acrylate; polyvinyl chloride; vinyl chloride copolymers such as copolymers of vinyl chloride and vinyl acetate; polyvinylidene chloride; vinylidene chloride copolymers; polystyrene; styrene copolymers such as copolymers of styrene and a maleate; poly(meth)acrylates; (meth)acrylate copolymers such as copolymers of a (meth)acrylate and vinyl acetate; vinyl acetate copolymers; polyvinyl acetal resins; gelatin; modified polyvinyl alcohols; polyamide resins such as nylons (polyamides), copolymer nylons and N-alkoxymethylated nylons; synthetic rubber; chlorinated rubber; and cellulose derivatives. Among them, there are preferred polyvinyl chloride, vinyl chloride copolymers, polyvinylidene chloride, vinylidene chloride copolymers, poly(meth)acrylates, (meth)acrylate copolymers, vinyl acetate copolymers, polyvinyl acetal resins and polyamide resins.

The above-described organic high-mulecular polymers may be used either along or as a mixture of two or more of them. Further, an additive such as adhesion improver may be added to the organic high-molecular polymer layer.

Thickness of the peelable organic high-molecular polymer layer is in the range of preferably about 0.1 to 4 $\mu$m, more preferably about 0.5 to 2 $\mu$m. When the organic high-molecular polymer layer is too thick, there is a difficulty in performing matting in due form, though the photopolymerizable adhesive layer to be provided thereon is still in a soft state, while when the polymer layer is too thin, there is a possibility that monomers which are contained in the photopolymerizable adhesive layer oozes out to the surface of the organic high-molecular polymer layer and that the surface of the polymer layer becomes sticky.

A photopolymerizable adhesive layer is provided on the organic high-molecular polymer layer. Any of conventional photopolymerizable adhesives or their functionally equivalent compositions may be used for the formation of the photopolymerizable adhesive layer of the invention.

Typical examples of the photopolymerizable adhesives include photopolymerizable materials containing at least one organic high-molecular polymer, an ethylenically unsaturated poly-functional monomer having a boiling point of 150° C. or higher under atmospheric pressure, and a photopolymerization initiator. Examples of such photopolymerizable adhesive are disclosed in more detail in the Japanese Patent Provisional Publication No. 59(1984)-97140.

The photosensitive image receiving material of the present invention can be used in the conventional image forming processes and image transferring processes.

The photosensitive image receiving material of the present invention is suitable for use in the improved image forming process described in the Japanese Patent Provisional Publication No. 59(1984)-97140 wherein an image laminated to the photopolymerizable adhesive layer of the image receiving sheet material is re-laminated to the permanent support, the support for the image receiving sheet material is removed from the photopolymerizable adhesive layer by utilizing the peelable organic high-molecular polymer layer before the light exposure procedure (i.e., curing procedure), and the matting treatment and the exposure procedure are then performed.

The exposure procedure can be performed according to the teaching of the Japanese Patent Provisional Publication No. 59(1984)-97140. The matting treatment can be carried out by the conventional process. In the process using the photosensitive image receiving sheet material of the present invention, the matting treatment is performed at a temperature of preferably 20°-180° C., more preferably 60° to 140° C. and at a pressure of preferably 0.1 to 20 kg/cm², more preferably 0.1 to 10 kg/cm².

The following examples are provided to illustrate the present invention without limiting it thereto.

EXAMPLE 1

Preparation of Image Receiving Sheet

A solution having the following composition was prepared as a coating for the formation of a peelable organic high-molecular polymer layer.

| | |
|---|---|
| Polyvinyl chloride (average degree of polymerization: 850, Geon 25, trademark of Nippon Geon Co., Ltd.) | 10 g |
| Vinyl chloride-vinyl acetate-vinyl alcohol copolymer (average degree of polymerization: 400, MPR-TA, trademark of Nisshin Kagaku Co., Ltd.) | 0.5 g |
| Methyl ethyl ketone | 240 g |
| Cyclohexanone | 60 g |

The coating solution was uniformly coated on a polyethylene terephthalate film (support, thickness: 100 μm) and dried to form an organic high-molecular polymer layer having a dry thickness of 1.0 μm.

A solution having the following composition was prepared to provide a photopolymerizable adhesive layer on the organic high-molecular polymer layer.

Coating solution for photopolymerizable adhesive layer

| | |
|---|---|
| Methyl methacrylate polymer (average molecular weight: 100,000, manufactured by Wako Junyaku Co., Ltd.) | 90 g |
| Pentaerythritol tetraacrylate | 90 g |
| Michler's ketone | 0.51 g |
| Benzophenone | 3.18 g |
| p-Methoxyphenol | 0.09 g |
| Methyl ethyl ketone | 220 g |

The coating solution was uniformly coated on the surface of the organic high-molecular polymer layer and dried to form a photopolymerizable adhesive layer having a dry thickness of 20 μm. Thus, an image receiving sheet was prepared.

EXAMPLE 2

Preparation of Image Receiving Sheet

The procedure of Example 1 was repeated except that a coating solution having the following composition was used as a coating for the organic high-molecular polymer layer to provide an organic high-molecular polymer layer having a dry tickness of 1.0 μm on the polyethylene terephthalate film.

Coating solution for organic high-molecular polymer layer

| | |
|---|---|
| Alcohol-soluble polyamide (CM-8000, manufactured by Toray Industries, Inc.) | 7.2 g |
| Polyhydroxystyrene (average molecular weight: 5500) | 1.8 g |
| Methanol | 300 g |
| Methyl cellosolve | 70 g |

In a similar manner to that described in Example 1, an image receiving sheet was prepared.

EXAMPLE 3

Preparation of Image Receiving Sheet

The procedure of Example 1 was repeated except that a coating solution having the following composition was used as a coating solution for the organic high-molecular polymer layer to provide an organic high-molecular polymer layer having dry thickness of 1.0 μm on the polyethylene terephtalate film.

Coating solution for organic high-molecular polymer layer

| | |
|---|---|
| Polyvinyl butyral (average degree of polymerization: about 630, #3000-1, trademark of Denki Kagaku Kogyo Co., Ltd.) | 38 g |
| Polyvinyl formal (average degree of polymerization: about 450, #20, manufactured by Denki Kagaku Kogyo Co.) | 0.6 g |
| Toluene | 700 g |
| Methanol | 300 g |

In a similar manner to that described in Example 1, an image receiving sheet was prepared.

EXAMPLE 4

Preparation of Image Receiving Sheet

The procedure of Example 1 was repeated except that a coating solution having the following composition was used as a coating solution for the organic high-molecular polymer layer to provide an organic high-molecular polymer layer having dry thickness of 1.0 μm on the polyethylene terephthalate film.

Coating solution for organic high-molecular polymer layer

| | |
|---|---|
| Ethylene-ethyl acrylate copolymer resin (EVAFLEX-EEA A-703, trademark of Mitsui-Du Pont Polychemical Co., Ltd.) | 5 g |
| Toluene | 180 g |

In a similar manner to that described in Example 1, an image receiving sheet was prepared.

COMPARISON EXAMPLE 1

Preparation of Image Receiving Sheet

The procedure of Example 1 was repeated except that a photopolymerizable adhesive layer was provided directly on the polyethylene terephthalate film without providing any organic high-molecular polymer layer to prepare an image receiving sheet.

Evaluation of Image Receiving Sheet

The following image transfer procedure was carried out using each of the image receiving sheets prepared in the above-described examples and comparison example to make the evaluation of the image receiving sheets.

(1) Preparation of color proofing sheet

Preparation of negative → positive type colored photosensitive transfer sheet

A solution having the following composition was prepared as a coating solution for the formation of peel layer.

| | |
|---|---|
| Alcohol-soluble polyamide [CM-8000, manufactured by Toray Industries, Inc., [η] = 23 cps (20° C., 10 wt. % methanol solution)] | 7.2 g |
| Polyhydroxystyrene (average molecular weight: 5,500, Resin M, manufactured by Maruzen Oil Co., Ltd.) | 1.8 g |
| Methanol | 400 g |
| Methyl Cellosolve | 100 g |

The coating solution was uniformly coated on the surface of a polyethylene terephthalate film (support, thickness: 100 μm) and dried to provide a peel layer having dry thickness of 0.5 μm.

For the purpose of negative → positive image formation, a photosensitive solution of each of four colors of yellow(Y), magenta(M), cyan(C) and black(B) was prepared as a coating solution for the formation of a photosensitive resin layer from the following resin solution and each of the following colorings (pigments).

Resin solution (common)

| | |
|---|---|
| Benzyl methacrylate-methacrylic acid copolymer (molar ratio: 73/27, viscosity [η] = 0.12) | 60 g |
| Pentaerythritol tetraacrylate | 43.2 g |
| Michler's ketone | 2.4 g |
| 2-(o-Chlorophenyl)-4,5-diphenylimidazole dimer | 2.5 g |
| Methyl cellosolve acetate | 560 g |
| Methyl ethyl ketone | 280 g |

Note:
Viscosity [η] is intrinsic viscosity in a methyl ethyl ketone solution at 25° C.

Coloring

| | | |
|---|---|---|
| Yellow coloring: | Seika Fast Yellow H-0755 (manufactured by Dainichiseika Color & Chemicals Mfg. Co., Ltd.) | 9.4 g |
| Magenta coloring: | Seika Fast Carmine 1483 (manufactured by Dainichiseika Color & Chemicals Mfg. Co., Ltd.) | 5.2 g |
| Cyan coloring: | Cyanine Blue 4820 (manufactured by Dainichiseika Color & Chemicals Mfg. Co., Ltd.) | 5.6 g |
| Black coloring: | Mitsubishi carbon black MA-100 (manufactured by Mitsubishi Chemical Industries, Ltd.) | 6.6 g |

The photosensitive solution of each of these four colors was coated on each of four sheets of the supports provided with the peel layer and dried to prepare a photosensitive resin layer having dry thickness of 2.4 μm.

Separately, a coating solution having the following composition was prepared for the formation of a protective layer. The coating solution was coated on the surface of the photosensitive resin layer of each color and dried to provide a protective layer having dry thickness of 1.5 μm.

| | |
|---|---|
| Polyvinyl alcohol (GL-05, manufactured by Nippon Synthetic Chemical Industry Co., Ltd.) | 60 g |
| Water | 970 g |
| Methanol | 30 g |

Thus, a negative → positive type colored photosensitive transfer sheet comprising a support (i.e., temporary sheet), a peel layer, a photosensitive resin layer and a protective layer in order was prepared for each of the four colors.

The photosensitive transfer sheet for each of the four colors was put upon the corresponding mask by using a register pin, and the image was exposed to light from the side of the mask for 30 to 60 seconds using a daylight contact MFG printer (P 607, manufactured by Dainippon Screen Co., 1 Kw ultrahigh pressure mercury vapor lamp used).

Each of the exposed transfer sheets was developed by using a processor (Fuji Color Art Processor CA-600P manufactured by Fuji Photo Film Co., Ltd.) for color proofing sheet and an alkali type developer (Fuji Color Art developer CA-1, manufactured by Fuji Photo Film Co., Ltd.) to obtain a color proofing sheet having halftone dot images on the peel layer for each of the four colors.

Preparation of positive → positive type colored photosensitive transfer sheet

A solution having the following composition was coated on the surface of the peel layer formed on the support according to the process described in the aforementioned "Preparation of negative → positive type colored photosensitive transfer sheet" and dried to prepare an intermediate layer having dry thickness of 0.5 μm.

| | |
|---|---|
| Polymethyl methacrylate (average molecular weight: 100,000) | 3 g |
| Methyl ethyl ketone | 100 g |

A pigment dispersion of each of four colors was prepared to provide a coloring material layer on the intermediate layer in the following manner.

In the first place, each of the following mother liquors A and B for the dispersion of the pigment was prepared.

Mother liquid A

| Styrene-maleic anhydride copolymer | 20 g |
|---|---|
| n-Propanol | 80 g |

Mother liquid B

| Methoxymethylated nylon (Toresin MF-30, trademark of Teikoku Kagaku Co., Ltd.) | 10 g |
|---|---|
| Methanol | 90 g |

Subsequently, a pigment dispersion of each of four colors of yellow(Y), magenta(M), cyan(C) and black(B) was prepared from the following resin solution and each of the following colorings (pigments).

Resin solution (common)

| Mother liquid A | 95 g |
|---|---|
| Mother liquid B | 30 g |
| n-Propanol | 28 g |
| Acetone | 20 g |

Coloring

| Yellow coloring: | Seika Fast Yellow H-0755 (manufactured by Dainichiseika Color & Chemicals Mfg. Co., Ltd.) | 12.2 g |
|---|---|---|
| Magenta coloring: | Seika Fast Carmine 1483 (manufactured by Dainichiseika Color & Chemicals Mfg. Co., Ltd.) | 12.2 g |
| Cyan coloring: | Cyanine Blue 4920 (manufactured by Dainichiseika Color & Chemicals Mfg. Co., Ltd.) | 12.2 g |
| Black coloring: | Mitsubishi carbon black MA-100 (manufactured by Mitsubishi Chemical Industries, Ltd.) | 12.2 g |

Dispersion was carried out for 6 hours by using a test dispersion mixer(paint shaker, manufactured by Toyo Seiki Co., Ltd.).

The following diluent for the pigment dispersion was prepared.

| n-Propanol | 40 g |
|---|---|
| Acetone | 28 g |
| Fluorine-containing surfactant (Flolard FC-430, manufactured by Sumitomo SM Co.) | 0.2 g |

The pigment dispersion of each of the four colors was diluted with the above diluent in a weight ratio set forth below, and the diluted dispersion was stirred for 10 minutes and subjected to an ultrasonic dispersing treatment for 10 minutes to obtain a coating solution for the formation of a pigment layer. The coating solution was filtered over a filter (Toyo Filter Paper No. 63 Filter), coated on the surface of the intermediate layer by means of whirler and dried at 100° C. for two minutes to form a coloring material layer of each of the four colors.

Yellow layer

| Pigment dispersion/diluent | 3.5/46.5 |
|---|---|
| Layer thickness | 2.1 μm |

-continued

| Optical density (blue filter) | 0.5 |
|---|---|

Magenta layer

| Pigment dispersion/diluent | 4/46 |
|---|---|
| Layer thickness | 0.65 μm |
| Optical density (green filter) | 0.75 |

Cyan layer

| Pigment dispersion/diluent | 4/46 |
|---|---|
| Layer thickness | 0.75 μm |
| Optical density (red filter) | 0.65 |

Black layer

| Pigment dispersion/diluent | 5.5/44.5 |
|---|---|
| Layer thickness | 0.7 μm |
| Optical density (no filter) | 0.9 |

Further, a positive type photosensitive solution having the following composition was filtered over No. 63 filter, coated on the surface of the pigment layer by means of whirler and dried at 100° C. for 2 minutes to prepare a positive—positive type colored photosensitive transfer sheet for each of the four colors.

| Adduct of an acetone-pyrogallol condensate (average degree of polymerization: 3) to 2-diazo-1-naphtol-4-sulfonyl chloride | 15 g |
|---|---|
| Novolak type phenol-formaldehyde resin (PR-50716, manufactured by Sumitomo Dures Co., Ltd.) | 30 g |
| Tricresyl phosphate | 5 g |
| Cyclohexanone | 120 g |
| n-Propyl acetate | 280 g |

The photosensitive transfer sheet for each of the four colors was exposed to light for 30 to 60 seconds and developed in a similar manner to that described in the aforementioned "Preparation of negative → positive type colored photosensitive transfer sheet" to obtain a color proofing sheet having halftone dot's image on the intermediate layer for each of the four colors.

Thus, there were obtained the negative → positive type and positive → positive type color proofing sheets for each of the four colors, wherein color separation mask was reproduced at high fidelity.

(2) Transferring process

Each color proof was prepared using the negative—positive type and position → positive type color proofing sheets for each of the four colors and the image receiving sheet in the following manner.

The black color proofing sheet and the image receiving sheet were placed together in layers in the manner of face-face lamination and processed by using Fuji Color Art Transferring Machine CA-600T (manufactured by Fuji Photo Film Co., Ltd.) under such conditions that temperature was 125° C., pressure was 4 kg/cm² and processing rate was 900 mm/min. The support on the side of the color proofing sheet was removed.

In a similar manner to that described above, registration was then carried out in order of cyan, magenta and yellow to transfer a four color's image to the image receiving sheet.

The face side of the image receiving sheet having the four color's image laminated thereto was placed on art paper, the laminate was processed by said transferring machine and the support of the image receiving sheet was removed to form the color image on the art paper. The mat side of a light-transmissive mat film (X-44, manufactured by Toray Industries, Inc.) and the surface of said color image were placed together in layers. The laminate was processed by said transferring machine under such conditions that temperature was 125° C., pressure was 4 kg/cm$^2$, and processing was 900 mm/min. The light exposure operation was then carried out from the side of the mat film for 100 to 180 seconds by using a daylight contact MFG printer (P-607, manufactured by Dainippon Screen Co., Ltd., 1 Kw ultra-high pressure mercury vapor lamp used) r. After exposure, only the mat film was removed to form fine roughness (matted surface) on the surface of the color image on said art paper.

Lowering in the quality of image caused by nitrogen gas generated in the matting stage was examined. The surface profile of the matted surface of the color image (the final image) on the art paper was observed through a magnifier. The results are shown in Table 1.

TABLE 1

| Image receiving sheet | Proofing sheet | Surface profile of final image | Lowering in quality of image caused by nitrogen gas |
|---|---|---|---|
| Ex. 1 | negative → positive type | homogeneous | no |
|  | positive → positive type | homogeneous | no |
| Ex. 2 | negative → positive type | homogeneous | no |
|  | positive → positive type | homogeneous | no |
| Ex. 3 | negative → positive type | homogeneous | no |
|  | positive → positive type | homogeneous | no |
| Ex. 4 | negative → positive type | homogeneous | no |
|  | positive → positive type | homogeneous | no |
| Comp. Ex. 1 | negative → positive type | peel marks observed | no |
|  | positive → positive type | peel marks observed | no |

We claim:

1. An image forming process which comprises the steps of:

exposing a photosensitive laminate composed of a peelable layer of an organic polymer and a photosensitive resin layer arranged on a temporary support to light;

developing the photosensitive resin layer to form a transferable image on the peelable layer;

transferring the transferable image onto an image receiving sheet material which comprises a photopolymerizable adhesive layer provided on a support via a peelable organic polymer layer;

transferring said photopolymerizable adhesive layer and said image transferred on the image receiving sheet material onto a permanent support;

removing the support of the image receiving sheet from said photopolymerizable adhesive layer and image on the permanent support;

subjecting the photopolymerizable adhesive layer and image on the permanent support to a matting treatment at a temperature of 20°–180° C. and a pressure of 0.1–20 kg/cm$^2$ using a matt film; and exposing the matted photopolymerizable adhesive layer and image to light to cure the adhesive layer.

2. The image forming process as claimed in claim 1, wherein the image laminated to the permanent support is further subjected to a matting treatment at a temperature of 60°–140° C. and a pressure of 0.1–10 kg/cm$^2$ using a matt film after removal of the support of the image receiving sheet, and then exposed to light.

3. The image forming process as claimed in claim 1, wherein the peelable organic polymer layer of the image receiving sheet has a thickness of 0.1 to 4 μm.

4. The image forming process as claimed in claim 1, wherein the peelable organic polymer layer comprises at least one polymer selected from the group consisting of polyvinyl chloride, a vinyl chloride copolymer, polyvinylidene chloride, a vinylidene chloride copolymer, polymethacrylate, polyacrylate, a methacrylate copolymer, an acrylate copolymer, a vinyl acetate copolymer, polyvinyl acetal resin and polyamide resin.

5. The image forming process as claimed in claim 1, wherein the photosensitive resin layer contains a photosensitive material which releases nitrogen gas during photolysis.

6. The image forming process as claimed in claim 1, wherein the photosensitive resin layer contains naphthaquinone diazide as a photosensitive material.

* * * * *